United States Patent
Choi et al.

(10) Patent No.: US 6,277,738 B1
(45) Date of Patent: Aug. 21, 2001

(54) METHOD OF MANUFACTURING A SEMICONDUCTOR DEVICE CAPABLE OF REDUCING CONTACT RESISTANCE

(75) Inventors: Hyung Bok Choi; Chang Seo Park; Hyeon Soo Kim, all of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/618,271

(22) Filed: Jul. 18, 2000

Related U.S. Application Data

(62) Division of application No. 09/338,525, filed on Jun. 23, 1999, now Pat. No. 6,114,241.

(51) Int. Cl.⁷ .................................................. H01L 21/44
(52) U.S. Cl. ........................ 438/655; 438/256; 438/399; 438/637
(58) Field of Search .......................... 438/655, 256–257, 438/381, 399, 683, 664, 666–668, 637–640, 233

(56) References Cited

U.S. PATENT DOCUMENTS

| 5,091,763 | 2/1992 | Sanchez . |
| 5,946,595 | 8/1999 | Doan et al. ........................... 438/659 |
| 6,136,649 * | 10/2000 | Hui et al. .............................. 438/257 |

FOREIGN PATENT DOCUMENTS

| 57-107030 | 7/1982 | (JP) . |
| 61-110462 | 5/1986 | (JP) . |
| 63-265448 | 11/1988 | (JP) . |
| 2-170423 | 7/1990 | (JP) . |
| 4-348039 | 12/1992 | (JP) . |
| 10-270572 | 10/1998 | (JP) . |
| 2000150459 * | 5/2000 | (JP) ............................. H01L/21/321 |

\* cited by examiner

*Primary Examiner*—Charles Bowers
*Assistant Examiner*—Thanh Nguyen
(74) *Attorney, Agent, or Firm*—Jacobson Holman, PLLC

(57) ABSTRACT

The present invention relates to a method of manufacturing a semiconductor device, which is capable of effectively removing a $WO_3$ film generated on a tungsten silicide during contact hole etch that opens a gate electrode including the tungsten silicide as its top film by selectively etching a interlayer insulating film. The $WO_3$ film is removed by a washing process using an alkaline solution such as TMAH (tetra-methyl-ammonium-hydroxide) or $NH_4OH$ solution. The effective removal of the $WO_3$ film reduces the contact resistance between a conductive material layer to be formed in the contact hole by a later process and the gate electrode, thereby improving the operative characteristics of the semiconductor device. TMAH solution used in the washing process has a high selectivity of $WO_3$ film relative to a thermal oxide film or a BPSG film that is generally used as the interlayer insulating film. Thus, the present invention is capable of minimizing the damage of the side parts of the interlayer insulating film during the washing process after contact etching.

9 Claims, 6 Drawing Sheets

METHOD OF MANUFACTURING A SEMICONDUCTOR DEVICE CAPABLE OF REDUCING CONTACT RESISTANCE

This is a DIVISIONAL of application Ser. No. 09/338,525 filed Jun. 23, 1999 now U.S. Pat. No. 6,114,241.

BACKGROUND OF THE INVENTION

The present invention relates to a method of manufacturing a semiconductor device, and more specifically to a method of reducing a contact resistance between a gate electrode(e.g. a word line in a semiconductor memory device) having a tungsten silicide film at the uppermost and another electrode (e.g. a bit line in a semiconductor memory device) to be formed in the later fabrication process.

In a cell area of semiconductor memory device, the active region(e.g. source/drain region) is coupled to the bit line though a contact hole, while in a peripheral circuit area a word line (or gate electrode) is coupled to the bit line through contact hole. The uppermost part of the word line (or gate electrode) is composed of tungsten silicide film and the bit line is generally composed of a doped polysilicon film(or conductive polysilicon film) or a polycide film. In the peripheral circuit area, a polysilicon bit line is coupled to the tungsten silicide ($WSi_x$) word line.

When an interlayer insulating film is selectively etched so as to open contact holes, the surface of the tungsten silicide ($WSi_x$) film is oxidized to generate a tungsten oxide ($WO_3$) film thereon. Accordingly, in order to reduce the contact resistance with the bit line a washing process should be made, conventionally using HF or fluorine containing solution after the etch for contact hole formation. However, in the peripheral circuit area, the $WO_3$ film that has been formed during the dry etch of contact hole formation using $CF_4$ and $O_2$ gas is not effectively removed so that the contact resistance is undesirably high.

Also, a long-time washing using HF solution is required for completely removing the $WO_3$ film. However, The long-time washing causes problem in that the BPSG film(or the interlayer insulating film) is undesirably much etched, thereby undesirably enlarging the width of the contact hole. This problem occurs not only in the contact hole formation for exposing the surface of tungsten silicide film but also tungsten film.

SUMMARY OF THE INVENTION

Accordingly, the object of the present invention is to provide a method of manufacturing a semiconductor device capable of reducing a contact resistance by effectively removing $WO_3$ film generated during an etch of contact hole formation.

Another object of the present invention is to provide a method of manufacturing a semiconductor memory device capable of reducing a contact resistance between a word line and a bit line.

Still another object of the present invention is to provide a method of manufacturing a semiconductor device for effectively removing a $WO_3$ film generated on a tungsten silicide film without undesirable damage to an interlayer insulating film.

To achieve the objects of the present invention, there is provided a method of manufacturing a semiconductor device comprising the steps of: forming a first electrode on a semiconductor substrate, said first electrode including a tungsten silicide($WSi_x$) layer at the uppermost part; forming an interlayer insulating film over the first electrode; selectively etching the interlayer insulating film to expose the tungsten silicide layer, wherein a tungsten oxide ($WO_3$) film is generated on the tungsten silicide layer by the etching; washing the tungsten oxide film using an alkaline solution; and forming a second electrode coupled to the exposed tungsten silicide layer.

In one preferred embodiment, the alkaline solution is TMAH(tetra-methyl-ammonium-hydroxide) solution or TMAH containing solution and the TMAH solution is preferably about 2.35 wt % in density. Also, it is preferable that the washing step is performed at 60° C.~70° C. and the thickness of the $WO_3$ film removed in the step of washing is equal to or less than 50 Å. The interlayer insulating film may be composed of BPSG and the step of selectively etching the interlayer insulating film may be a dry etching by use of $CF_4+O_2$.

In another preferred embodiment, the method further comprises the step of performing an additive washing by use of HF or fluorine containing solution6 after the step of washing.

The present invention also provide a method of manufacturing a semiconductor memory device comprising the steps of: forming word lines on a semiconductor substrate that can be sectioned into a cell area and a peripheral circuit area, each of the word lines including a tungsten silicide layer at the uppermost part thereof; forming an interlayer insulating film over the word lines; selectively etching the interlayer insulating film so as to open contact holes some of which expose the semiconductor substrate in the cell area and another of which expose the word line in the peripheral circuit area, wherein tungsten oxide($WO_3$) films are generated on the tungsten silicide layer by the etching; and performing a washing process using alkaline solution to remove the tungsten oxide films.

In the preferred embodiments, the step of forming word lines comprises the steps of: forming a polysilicon film having 500 Å~900 Å in thickness; forming a $WSi_x$ film having 600 Å~900 Å in thickness; etching the $WSi_x$ film and the polysilicon film by photolithography to form gate electrodes; forming spacers on the sides of the gate electrodes. The interlayer insulating film may be composed of BPSG film having 700 Å~1100 Å in thickness and the step of etching the interlayer insulating film is made by dry etch by use of the mixed gas of $CF_4+O_2$. The alkaline solution used in the step of performing a washing process may be a 2.35 wt % of TMAH solution, 20 wt %~30 wt % of $NH_4OH$ containing solution, or a mixed chemical including at least $H_2O_2$ solution. The step of performing a washing process may be preferably conducted at 50° C.~80° C. and more preferably at 60° C.~70° C. and still more preferably at about 65° C. Also, the method may further comprise the steps of forming a conductive polysilicon layer coupled to the tungsten silicide layer after the step of performing a washing process; and patterning the conductive polysilicon layer to form bit lines.

In addition, in the step of performing a washing process the etch condition may be preferably controlled such that the etch rate of the tungsten oxide film is 200 Å/min~400 Å/min and the etch rate of BPSG film is 60 Å/min~70 Å/min.

The method may further comprise the step of performing an additive washing by use of HF or fluorine containing solution after the step of washing.

The present invention still provides a method of forming contact holes in a semiconductor device, comprising the steps of:

opening contact holes by selectively etching an interlayer insulating film, wherein at least one of the contact holes exposes the surface of conductive tungsten containing film; and washing the inside of the contact holes using TMAH(tetra-methyl-ammonium-hydroxide) solution. This contact hole formation method may further comprise the step of performing an additive washing of the inside of the contact holes by use of HF or fluorine containing solution after the step of washing. The contact holes may be formed by dry etch using a mixed gas with $CF_4$ and $O_2$ and the conductive tungsten containing film can be a tungsten silicide film or a tungsten film.

In summary, according to the present invention washes, the $WO_3$ film generated during etching the BPSG interlayer insulating film for a contact hole formation is washed using an alkaline solution such as $NH_4OH$ solution or TMAH solution having high etch selectivity in order to reduce the contact resistance between a word line and bit line, in which the word line is composed of a tungsten silicide film at the uppermost part and the bit line is composed of conductive material such as doped polysilicon formed in later process.

BRIEF DESCRIPTION OF THE DRAWINGS

For a more complete understanding of the present invention and the advantage thereof, reference is now made to the following description taken in conjunction with the accompanying drawings in which.

DETAILED DESCRIPTION OF THE PRESENT INVENTION

The preferred embodiment of the present invention will hereinafter be described in detail with reference to the accompanying drawings.

FIGS. 1–5 show the cross sectional views of illustrating a method of manufacturing a semiconductor device, according to one preferred embodiment of the present invention.

Figure 1:
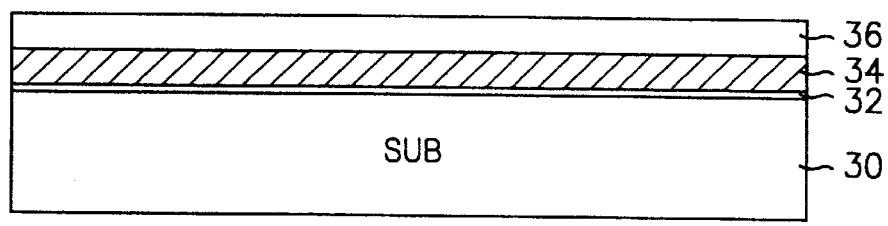
FIGS. 1–5 show the cross sectional views of illustrating a method of manufacturing a semiconductor device, according to one preferred embodiment of the present invention.

Referring to FIG. 1, a gate oxide film 32, a polysilicon film 34 and a tungsten silicide film 36 are sequentially formed on a semiconductor substrate 30. The polysilicon film 34 is composed of, for example, doped polysilicon film(or conductive polysilicon film) having the thickness of 500 Å~900 Å. The thickness of the tungsten silicide film 36 is for example 600 Å~900 Å.

Figure 2:
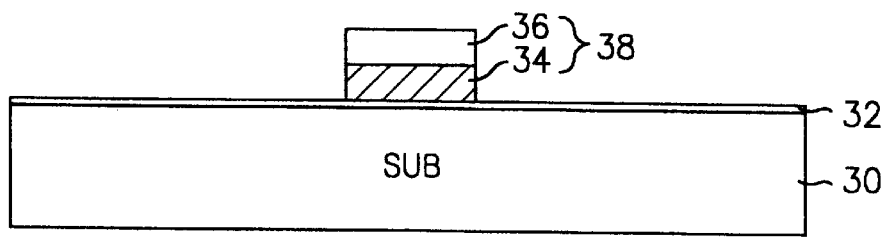

Then, as shown in FIG. 2, the tungsten silicide film 36 and the polysilicon film 34 are patterned by photolithography technology so as to form a gate electrode 38. Here, the gate electrode 38 corresponds to the first electrode in the claims.

Figure 3:
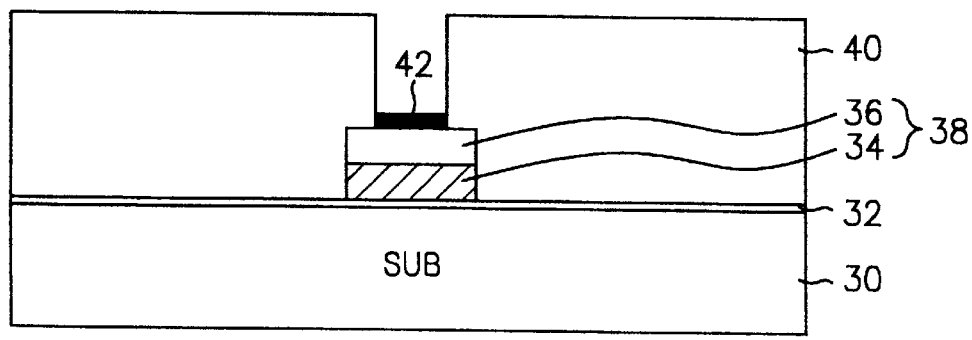

Subsequently, an interlayer insulating film 40 is deposited on the semiconductor structure and a photoresist pattern (not shown) for the contact hole formation is formed. The interlayer insulating film 40 is selectively etched using the photoresist pattern as an etch mask so as to form a contact hole. The contact hole etch can be performed by a dry etch process, for example, using $CF_4$ and $O_2$ gas. As shown in FIG. 3, the contact hole etch generates a $WO_3$ film 42 on the surface of the tungsten silicide film 36 that is located at the uppermost part of the gate electrode 38. The thickness of $WO_3$ film 42 is typically 20 Å~20 Å.

Figure 4:
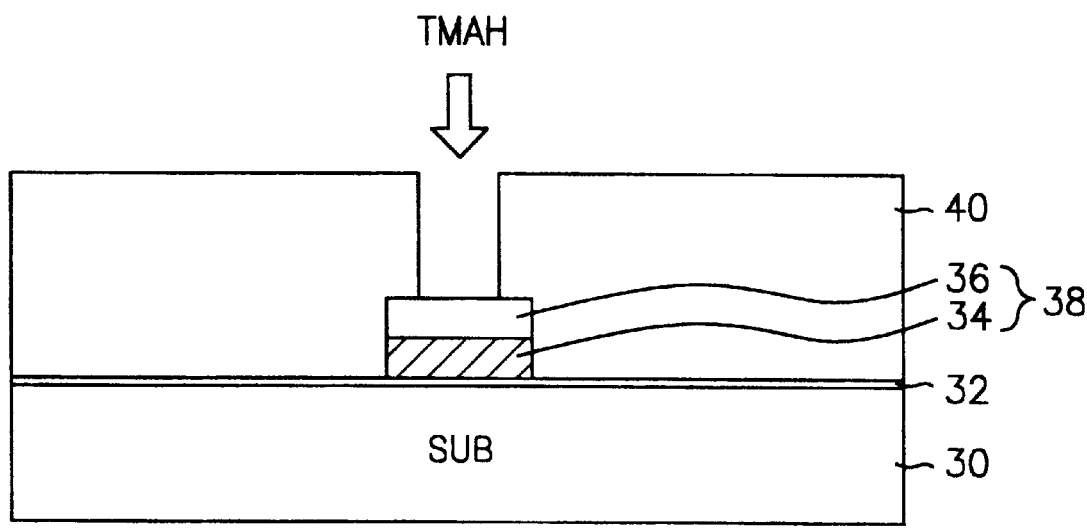

The $WO_3$ film 42, as illustrate in FIG. 4, is removed by a washing process using an alkaline solution such as TMAH solution. The temperature of the TMAH solution for washing is preferably 60° C.~70° C. and more preferably about 65° C. The etch rate of the $WO_3$ film 42 in this washing process is about 200 Å/min. Also, in this washing process, the etch rate of the thermal oxide film (such as gate oxide film) is about 0.3 Å/min, the etch rate of the BPSG interlayer insulating film 40 is about 7.5 Å/min and the etch rate of the polysilicon is about 70 Å/min.

The following table 1 shows the etch rates of films in accordance with the washing materials.

TABLE 1

| WASHING MATERIALS | 50:1 HF | SC-1(1:1:5) at 80° C. | TMAH(2.35 wt %) at 65° C. |
|---|---|---|---|
| polysilicon film | ≅0 Å/min | ~12 Å/min | ≧70 Å/min |
| BPSG film | ≅750 Å/min | ~80 Å/min | 7.5 Å/min |
| thermal oxide film | 60 Å/min | 3 Å/min | 0.1 Å/min |
| tungsten oxide film | <0.1 Å/min | ~200 Å/min | ~200 Å/min |

Referring to table 1, when the washing process is made using a diluted HF gas to 1/50, the etch rate of $WO_3$ is much higher than that of thermal oxide film.

In contrast, when the washing is performed using a 2.35 wt % TMAH solution at 65° C., the etch rate of the tungsten oxide film is about 200 Å/min, the etch rate of the thermal oxide film is about 0.1 Å/min and the etch rate of BPSG film is about 7.5 Å/min. It is apparent that the etch rate of tungsten oxide film is relatively much higher than that of BPSG interlayer insulating film or that of the gate oxide. That is, the etch selectivity of tungsten oxide film is very high. In the table 1, SC-1 represents the washing solution composed of $NH_4OH$ of about 30 wt % in density, $H_2O_2$ of about 30 wt % in density and $H_2O$ in the volume ratio of 1:1:5, respectively.

Based on the etch rates of table 1, the washing time can be controlled in accordance with the thickness of the $WO_3$ film 42. For example, for removing 500 Å of tungsten oxide film, the washing time may be set to about 3 minutes when using TMAH solution. In this case, the BPSG film commonly used as the interlayer insulating film is etched only by the amount of about 20 Å, so that the damage at the side of the interlayer insulating films can be prevented. In addition, even if another contact hole for exposing the surface of the gate oxide film 32 is opened different from the drawing, the exposed gate oxide film 32 would be barely damaged so that the underlying source/drain regions is prevented from being damaged.

In accordance with another embodiment, the washing process for $WO_3$ film 42 can be made using $NH_4OH.H_2O$ solution or $NH_4OH$ containing solution at 50° C.~80° C. More preferably, the washing temperature can be controlled to 50° C.~70° C. In this washing process, the etch rate of the $WO_3$ film 42 is 200 Å/min~400 Å/min. Also, the etch rate of the thermal oxide film is 1 Å/min~2 Å/min, the etch rate of the polysilicon film is 20 Å/min~30 Å/min and the etch rate of BPSG film typically used as the interlayer insulating film is 60 Å/min~70 Å/min. Thus, even if another contact holes for exposing the surfaces of the semiconductor substrate 30 or the gate oxide film 32 are opened different from FIGS. 3–5, this washing process give very little damage to the semiconductor substrate 30 or the gate oxide film 32.

Also, the width of the contact hole can be prevented from being enlarged during the washing process since the etch rate of the $WO_3$ film 42 is much higher than that of the BPSG film.

According to still another embodiment, the washing process can be made using a mixed chemical of 20 wt %~30 wt % $NH_4OH.H_2O$ solution, $H_2O_2$ solution and pure water.

After such washing process is finished, an additive washing process may be optionally performed using a diluted HF or fluorine containing solution. The additive washing process is for removing a native oxide film having the thickness of 10 Å or below.

Figure 5:
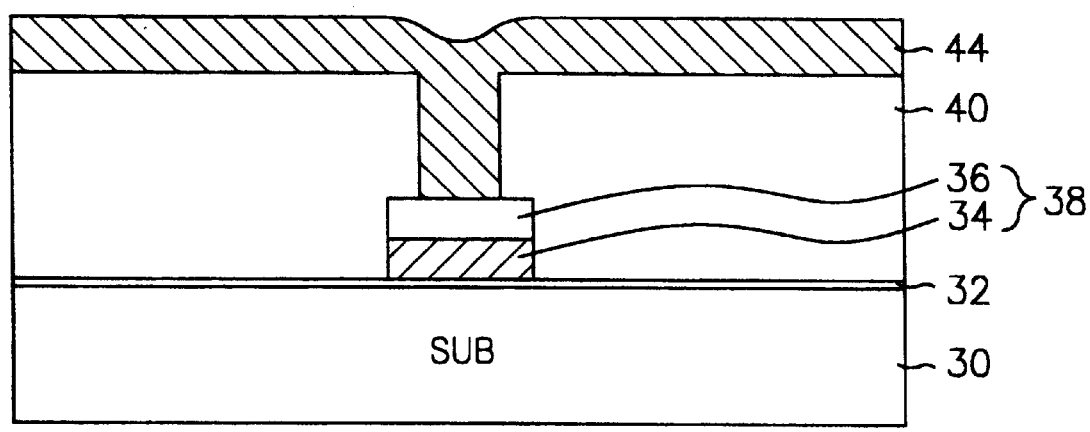

Then, as shown in FIG. 5, a conductive material is deposited on the contact hole and then patterned so as to form a signal line 44. Here, the signal line 44 corresponds to the second electrode in the claims or the bit line in a semiconductor memory device. In a preferred embodiment, the signal line 44 can be formed with a doped polysilicon having 500 Å~2000 Å in thickness.

FIGS. 6–12 show the cross sectional views of illustrating a method of manufacturing a semiconductor device, according to another preferred embodiment of the present invention. The semiconductor memory device is in general sectioned into a cell area and a peripheral circuit area. The cell area includes a number of cell array and the peripheral circuit area includes various circuits for controlling access to the memory cell array.

Figure 6:
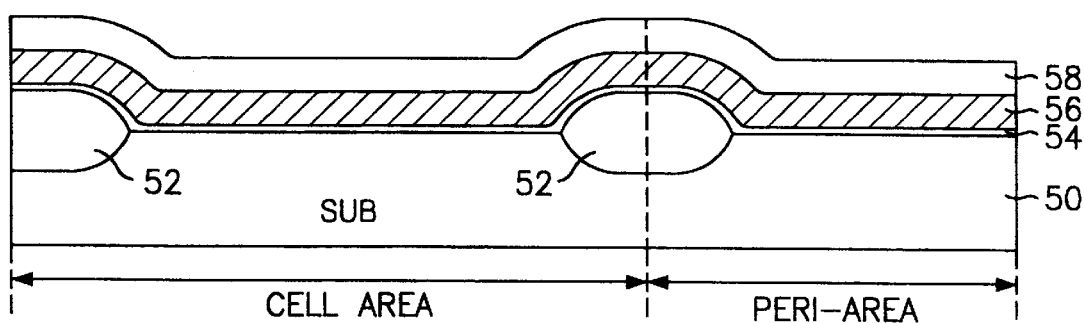
FIGS. 6–12 show the cross sectional views of illustrating a method of manufacturing a semiconductor device, according to another preferred embodiment of the present invention.
Figure 7:
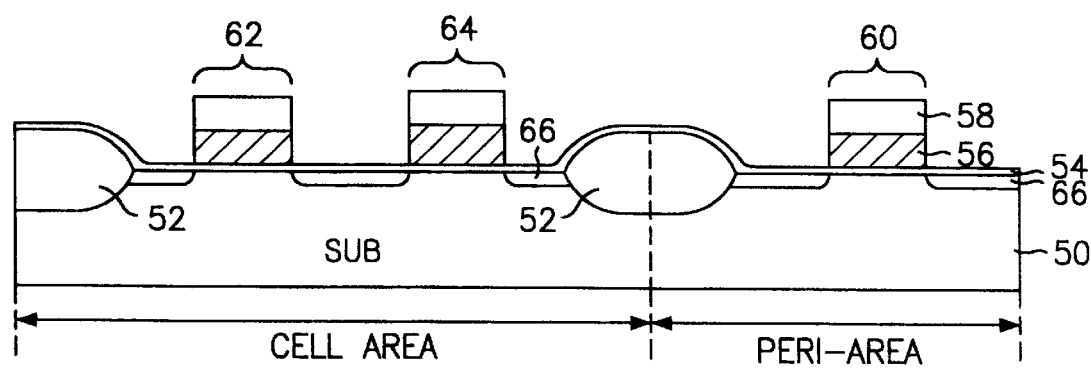

Referring to FIG. 6, field oxide layers 52 are formed in a semiconductor substrate 50 by conventional technology. Then, a gate insulating film 54, a polysilicon film 56 and a tungsten silicide film 58 are sequentially formed on the semiconductor substrate 50. As shown in FIG. 7, the polysilicon film 56 and the tungsten silicide film 58 are patterned by conventional photolithography process so as to form the gate electrodes 60, 62 and 64. Then, a first ion implantation is performed with low energy for forming a LDD structure of source/drain, so as to form lightly doped source/drain regions 66.

Figure 8:
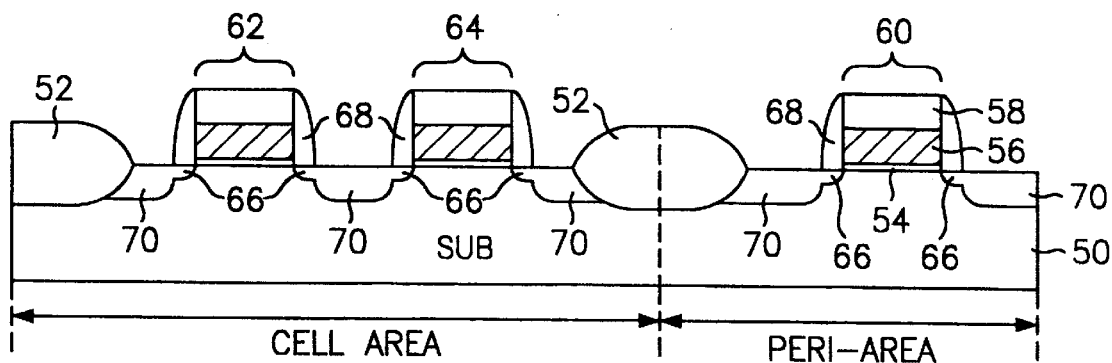

After forming the lightly doped source/drain region 66, a conformal insulating layer is deposited over the semiconductor structure and anisotropically etched to form spacers 68 on the vertical sides of the gate electrodes 60, 62 and 64. A second ion implantation is performed with high energy for forming a LDD structure of source/drain, so as to form highly doped source/drain regions 70 as shown in FIG. 8. In the second ion implantation the gate electrodes 60, 62 and 64 and the spacers 68 play a role of preventive mask of ion implant. Here, the gate electrode and the source/drain regions constitute a MOS transistor. In a dynamic random access memory, a unit memory cell is composed of one transistor and one capacitor and the gate electrode of the transistor is coupled to the word line. In other words, the gate electrodes 60, 62 and 64 in the cell area correspond to word lines and also to the first electrode in the claims.

Figure 9:
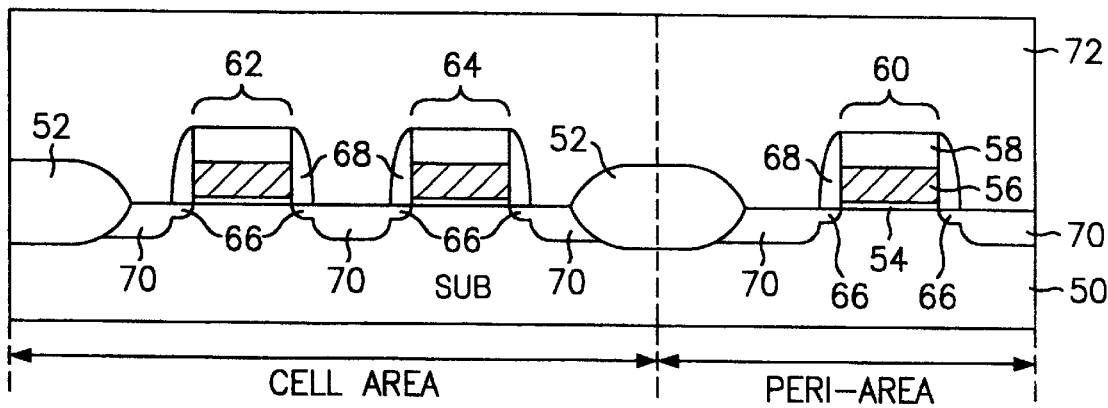
Figure 10:
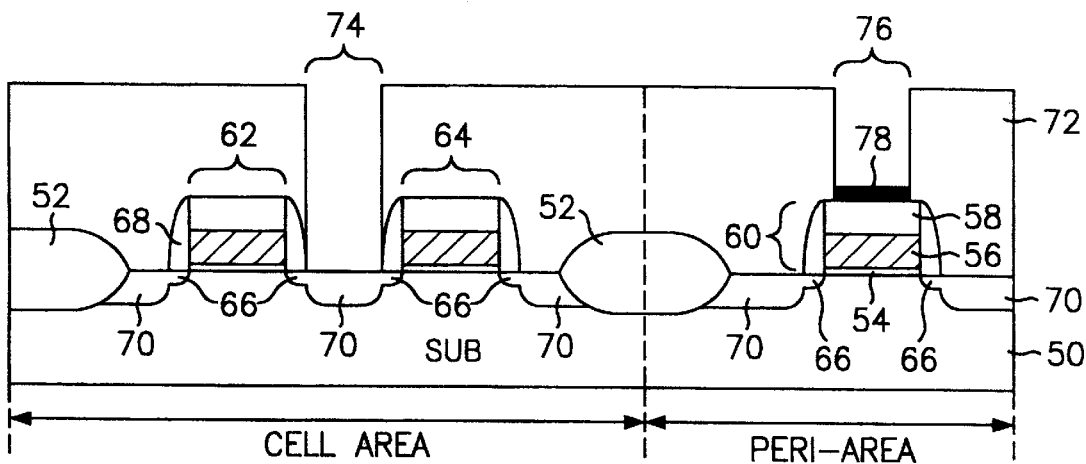

In FIG. 9, an interlayer insulating film 72 is formed on the entire surface of the semiconductor structure. The interlayer insulating film 72 is selectively etched as depicted in FIG. 10 so as to open contact holes 74 and 76. The contact hole 76 in the peripheral circuit area exposes the surface of the tungsten silicide film 58 located at the uppermost part of the gate electrode 60 while the contact hole 74 in the cell area exposes the source/drain region 70. The interlayer insulating film 72 is typically composed of BPSG material and the contact hole etch in the interlayer insulating film 72 is generally performed using a mixed gas of $CF_4+O_2$. Such contact hole etch undesirably generates a tungsten oxide film 78 on the surface of the tungsten silicide film 58 exposed.

Figure 11:
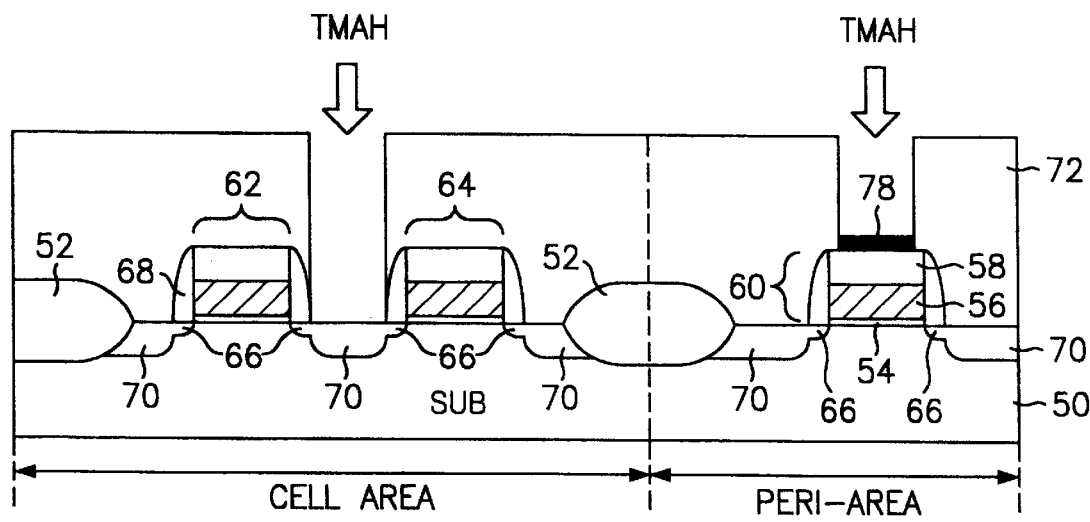

Referring to FIG. 11, for removing the tungsten oxide film the washing of the present invention is performed. The washing process can be made as explained with reference to FIG. 4. That is, the washing process for removing the $WO_3$ film 42 can be made, using an alkaline solution such as TMAH solution at 60° C.~70° C. (more preferably at about 65° C.), or using $NH_4OH.H_2O$ solution or $NH_4OH$ containing solution at 50° C.~80° C., or using a mixed chemical of 20 wt %~30 wt % $NH_4OH.H_2O$ solution, $H_2O_2$ solution and pure water. Also, a second washing may be additively performed using diluted HF or fluorine containing solution after the first washing as above is finished. In the first washing process, there is a possibility that a native oxide film is formed on the exposed source/drain region in the cell area by the high temperature of alkaline solution. So, the second washing process for removing the native oxide film formed on the source/drain region during the first washing process may be required.

Figure 12:
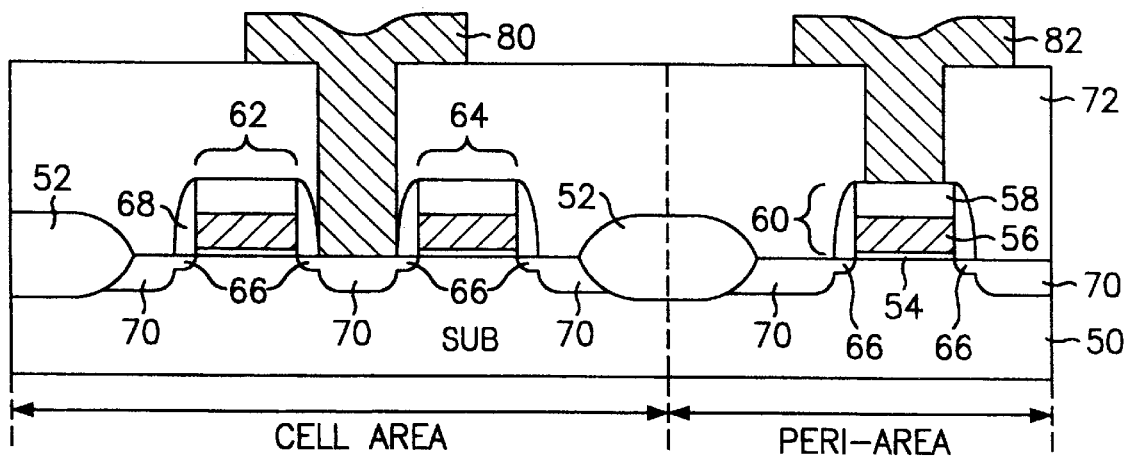

After the washing processes are completed, as shown in FIG. 12, a conductive material is deposited and then patterned to form bit lines 80 and 82. The bit lines 80 and 82 correspond to the second electrode in the claims and may be composed of doped polysilicon, metal or multi-layer polycide structure and etc. the thickness of the bit lines 80 and 82 are 500 Å~2000 Å in one preferred embodiment of the present invention.

The present invention proposes a method of effectively removing $WO_3$ film that increases the contact resistance between the word line having tungsten polycide structure and the bit line, thereby preventing the deterioration of the device characteristics.

Although preferred embodiments of the present invention have been illustrated and described, various alternatives, modifications and equivalents may be used. Therefore, the foregoing description should not be taken as limiting the scope of the present invention which is defined by the appended claims.

Specifically, though the above explanation has been made related to the contact hole formation for exposing the surface of tungsten silicide film, the teaching of the present invention is also applied to the contact hole formation for exposing the surface of tungsten film. Also, the gate electrode may have multi-layer structure as long as the top layer thereof is composed of tungsten containing material.

What is claimed is:

1. A method of manufacturing a semiconductor memory device comprising the steps of:
    forming word lines on a semiconductor substrate that can be sectioned into a cell area and a peripheral circuit area, each of the word lines including a tungsten silicide layer at the uppermost part thereof;
    forming an interlayer insulating film over the word lines;
    selectively etching the interlayer insulating film so as to open contact holes, some of which expose the semiconductor substrate in the cell area and another of which expose the word line in the peripheral circuit area, wherein tungsten oxide($WO_3$) films are generated on the tungsten silicide layer by the etching; and
    performing a washing process using alkaline solution to remove the tungsten oxide films.

2. The method of the claim 1, wherein the step of forming word lines comprises the steps of:
    forming a polysilicon film;
    forming a $WSi_x$ film;
    etching the $WSi_x$ film and the polysilicon film by photolithography to form-gate electrodes;

forming spacers on the sides of the gate electrodes.

3. The method of the claim 1, wherein the interlayer insulating film is composed of BPSG film.

4. The method of the claim 1, wherein the step of etching the interlayer insulating film is made by dry etch.

5. The method of the claim 1, wherein the alkaline solution used in the step of performing a washing process is a TMAH solution.

6. The method of the claim 1, wherein the alkaline solution is $NH_4OH$ containing solution.

7. The method of the claim 1, wherein the alkaline solution is a mixed chemical including at least $H_2O_2$ solution.

8. The method of the claim 1, further comprising the steps of:

forming a conductive polysilicon layer coupled to the tungsten silicide layer after the step of performing a washing process; and patterning the conductive polysilicon layer to form bit lines.

9. The method of the claim 1, further comprising the step of performing an additive washing by use of HF or fluorine containing solution after the step of washing.

* * * * *